United States Patent
Preti et al.

(10) Patent No.: US 7,153,368 B2
(45) Date of Patent: Dec. 26, 2006

(54) SUSCEPTOR WITH EPITAXIAL GROWTH CONTROL DEVICES AND EPITAXIAL REACTOR USING THE SAME

(75) Inventors: Franco Preti, Milan (IT); Srinivas Yarlagadda, Salem, NE (US)

(73) Assignee: LPE SpA, Milan (IT)

( * ) Notice: Subject to any disclaimer, the term of this patent is extended or adjusted under 35 U.S.C. 154(b) by 211 days.

(21) Appl. No.: 10/488,343

(22) PCT Filed: Sep. 5, 2002

(86) PCT No.: PCT/EP02/10043
§ 371 (c)(1),
(2), (4) Date: Feb. 27, 2004

(87) PCT Pub. No.: WO03/023093
PCT Pub. Date: Mar. 20, 2003

(65) Prior Publication Data
US 2005/0005858 A1    Jan. 13, 2005

(30) Foreign Application Priority Data
Sep. 7, 2001    (IT)    ................ MI01A1881

(51) Int. Cl.
C23C 16/00    (2006.01)
C23F 1/00    (2006.01)
H01L 21/306    (2006.01)
(52) U.S. Cl. ............... 118/728; 118/715; 118/725; 156/345.51

(58) Field of Classification Search ................ 118/728; 156/345.51
See application file for complete search history.

(56) References Cited

U.S. PATENT DOCUMENTS 4,579,080 A * 4/1986 Martin et al. ............... 118/500
6,071,351 A * 6/2000 Venkatasubramanian .... 118/725

FOREIGN PATENT DOCUMENTS

| EP | 0 415 191 A | 3/1991 |
| IT | 1 215 444 | 11/1988 |
| IT | 1 261 886 | 6/1996 |
| JP | 02 212393 A | 8/1990 |
| WO | WO 00 58533 A | 10/2000 |

* cited by examiner

Primary Examiner—Parviz Hassanzadeh
Assistant Examiner—Rakesh Dhingra
(74) Attorney, Agent, or Firm—Katten Muchin Rosenman LLP

(57) ABSTRACT

A susceptor (1) for epitaxial growth reactors comprises a body (2) having a lower base (3), an upper top (4) and some substantially flat side faces (5); the side faces are adapted to receive, in predetermined areas (6), substrates on which the epitaxial growth develops; body (2) is provided with edge side regions (7) defined by couples of adjacent side faces (5); along edge side regions (7) in the upper part of body (2) there are provided first ribs (8) adapted to control the flow of reaction gases along side faces (5); along edge side regions (7) in the lower part of body (2) there are provided second ribs (9) adapted to control the flow of reaction gases along side faces (5).

10 Claims, 5 Drawing Sheets

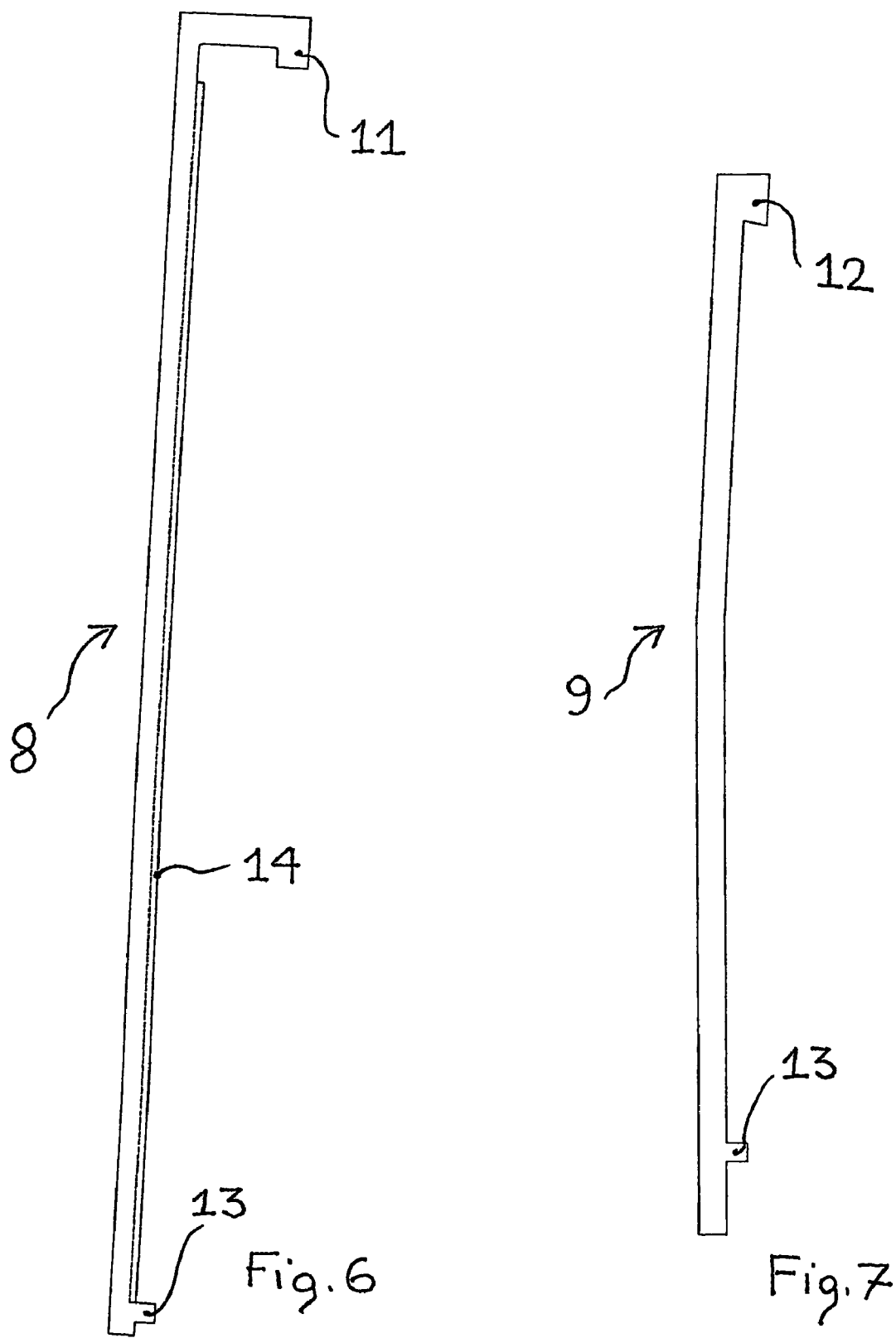

SUSCEPTOR WITH EPITAXIAL GROWTH CONTROL DEVICES AND EPITAXIAL REACTOR USING THE SAME

The present invention relates to a susceptor for epitaxial growth reactors according to the preamble of claim 1 and to an epitaxial reactor using the same. In the field of epitaxial reactors for the microelectronic industry, with the term "susceptor" it is meant the heated support that houses one or more substrates during the epitaxial growth process; such support is generally heated by availing of its susceptance; such support generally maintains the name of "susceptor" even in those reactors where heating takes place in other ways, for example through lamps. The present invention is independent from the heating method.

Epitaxial growth susceptors may be divided into two big groups: those where substrates lie in a substantially horizontal position during the epitaxial growth process and those where substrates lie in a substantially vertical position (often few degrees from the vertical direction) during the epitaxial growth process. The present invention applies to the second group of susceptors.

With reference to FIG. 5, such a susceptor comprises a body 2 having a lower base 3, an upper top 4 and some substantially flat side faces 5; side faces 5 are adapted to receive, in predetermined areas 6, substrates on which the epitaxial growth develops; body 2 is provided with edge side regions 7 defined by couples of adjacent side faces 5. Body 2 has the shape of a pyramid or, more often, of a truncated pyramid, and, for example, lower base 3 has the shape of a heptagon and upper top 4 has also the shape of a heptagon but of smaller size than lower base 3, side faces 5 are substantially rectangle-like shaped, whereby edge side regions 7 are substantially triangle-like shaped; in case that side faces 5 are substantially trapezium-like shaped, edge side regions 7 are true edges. A reactor with a susceptor having the shape of a truncated pyramid is known, for example, from Italian patent No.1,215,444 applied for in 1987.

As shown in FIG. 5, such a susceptor usually supports several substrates on each side face located vertically one upon the other and suitably spaced between each other; the number of substrates depends also on their diameter.

As it is well known, the susceptor is placed inside a bell jar usually made of quartz; in the bell jar reaction gases are injected; the flow of reaction gases along side faces 5 (where the substrates are located) allows and determines the growth on the exposed faces of the substrates; clearly, there are many parameters affecting the growth.

The quality and the regularity of the grown material are of the utmost importance for the use of the thus treated substrates by the microelectronic industry, and are highly affected by the regularity and uniformity of the flow of the reaction gases along side faces 5 of the susceptor and therefore along the substrates. Such flow must therefore be controlled carefully.

In the past, it has been proposed by the applicant of the present patent application, for example in Italian patents No.1,231,547 applied for in 1989 and No.1,261,886 applied for in 1992 and in Italian patent application No.MI99A000607 filed in 1999, the use of first ribs placed along the edge side regions and such as to control the flow of reaction gases along the side faces.

While initially (in 1989) it was proposed that such ribs extend from the top of the body to the base of the body, later (from 1992 till today), at the implementation stage of the idea into products, it was preferred to limit their extension to the upper part of the body; this was due to two reasons: the assumed uselessness of the lower part of the ribs and the deformations of the ribs caused by the environment conditions in the reaction chamber, these deformations being proportional to their length.

Recently, it is becoming widespread to use, for the fabrication of microelectronic devices, also areas of the substrate really next to its edge (few millimeters).

From effected measurements it has been found that, if these areas really next to the edge are also considered, the uniformity of the grown material becomes considerably worse, particularly, for those substrates being nearest to the lower base.

Anyway, it has been checked that the simple idea of making the ribs longer down to, for example, the lower base is not effective; in fact, the lengthening of the ribs leads to an improvement in the thickness of the material grown in the areas next to the edge and to the rib but to a worsening, for example, in the areas next to the edge but far from the rib.

The present invention is aimed at solving the problem of the uniformity of the thickness of epitaxially grown substrates better than it has been done in the past.

Such problem is solved through a susceptor having a body having a lower base, an upper top and some substantially flat side faces, said side faces being adapted to receive, in predetermined areas, substrates on which the epitaxial growth develops, and provided with edge side regions defined by couples of adjacent side faces, wherein along said edge side regions in the upper part of the body there are provided first ribs adapted to control the flow of reaction gases along said side face, characterized in that along said edge side regions in the lower part of the body there are provided second ribs adapted to control the flow of reaction gases along said side faces.

The use of second ribs separated and spaced from the first ribs and located in the lower part of the susceptor body considerably improves the uniformity in the thickness of the epitaxially grown substrate especially in the area of the substrate edge.

If necessary, further ribs may be provided in the central part of the substrate body. According to another aspect the present invention relates also to an epitaxial reactor having at least a reaction chamber, wherein in a or each reaction chamber there is located at least a susceptor having a body having a lower base, an upper top and some substantially flat side faces, said side faces being adapted to receive, in predetermined areas, substrates on which the epitaxial growth develops, and provided with edge side regions defined by couples of adjacent side faces, wherein along said edge side regions in the upper part of the body there are provided first ribs adapted to control the flow of reaction gases along said side face, characterized in that along said edge side regions in the lower part of the body there are provided second ribs adapted to control the flow of reaction gases along said side faces and using such susceptor.

The present invention will become clearer from the following description to be considered in conjunction with the accompanying drawings, wherein:

FIG. 1 shows a reaction chamber of an epitaxial reactor according to the present invention, FIG. 2 shows a partial cross-section along horizontal plane A—A of the chamber of FIG. 1, FIG. 3 shows a partial cross-section along horizontal plane B—B of the chamber of FIG. 1, FIG. 4 shows a susceptor according to the present invention provided with two sets of ribs, FIG. 5 shows the body of the susceptor of FIG. 4 without ribs, FIG. 6 shows a first strip for susceptors according to the present invention, and FIG. 7 shows a second strip for susceptors according to the present invention.

With reference to the figures, particularly FIG. 4 and FIG. 5, susceptor 1 for epitaxial growth susceptors according to the present invention comprises a body 2 having a lower base 3, an upper top 4, and some substantially flat side faces 5; side faces 5 are adapted to receive, in predetermined areas 6, substrates on which the epitaxial growth develops; body 2 is provided with edge side regions 7 defined by couples of adjacent side faces 5; along edge side regions 7 in the upper part of body 2 there are provided first ribs 8 adapted to control the flow of reaction gases along side faces 5; additionally still along edge side regions 7 but in the lower part of body 2 there are provided second ribs 9 adapted to control the flow of reaction gases along side faces 5.

Second ribs 9 are therefore separated and suitably spaced from first ribs 8 and placed in such a way as to improve the thickness of the material grown in the areas next to the edge and to the rib but, at the same time, not to substantially worsen the thickness of the material grown elsewhere. The first and second ribs are spaced apart by a gap 30.

If necessary, particularly if the number of substrates per face is big, it may be advantageous to provide that along edge side regions 7 in the central part of body 2 third (and, if the case, further) ribs be provided adapted to control the flow of reaction gases along side faces 5; these are therefore separated and suitably spaced from both first ribs 8 and second ribs 9.

The fact that the ribs are of limited length, in addition to allowing a better flow control, reduces the mentioned problem of the deformations of the ribs; in fact, if the ribs get deformed (mainly due to the very high temperatures in the reaction chamber) the effect on the flow of reaction gases changes with time and therefore it is difficult to predict contrary to what would be required.

Such ribs, according to their simplest but still effective embodiment, may consist of strips; each strip is placed centrally along an edge side region 7.

Alternatively, such ribs may consist of couples of strips; a first strip of the couple is placed along a first edge of a side region 7 and a second strip of the couple is placed along a second edge of the same side region 7.

The ribs are preferably made of the same material of the susceptor body, that is graphite covered by silicon carbide; the use of quartz covered by silicon carbide is not advisable as it makes problems when cleaning the strips; in fact, these need to be periodically cleaned from the material deposited on themselves during the repeated epitaxial growth reactions.

Although it is advantageous to use the same material for both the ribs and the susceptor body, it is preferable that these be distinct parts for limiting the heat flow from the body to the ribs; in fact, if the ribs would substantially contribute to the heating of the substrates, this would be inevitably uneven.

If the strips are attached to the susceptor body, the strip may be shaped in such a way as to have at a first end a hook 11 or a tooth 12, as it is clearly shown in FIG. 6 and in FIG. 7, that allows fixing to the susceptor body; additionally, it is preferable that, at a second end, the strip be provided with a centring pin 13 that avoids oscillatory movements of the strip when the susceptor is rotated in the reaction chamber.

Clearly, on the susceptor body there must be provided suitable holes or suitable recesses for the hook, the tooth and the pin: these are clearly shown in cross-section on the left side of FIG. 4 and FIG. 5.

In order to further limit the heat flow from the body to the strips, the strip may be provided with a groove 14 on the side leaning on the susceptor body; in this way, the surface of the strip in contact with the body is extremely limited.

As already highlighted, the placement of the ribs is extremely important for achieving the desired effect.

It has been experimentally found that a good result is obtained when first ribs 8 extend from a level corresponding to about top 4 of body 2, to a level corresponding to about the centre of one of substrate areas 6, particularly the area 6a nearest to top 4 of body 2.

As regards second ribs 9, it has been experimentally found that a good result is obtained when second ribs 9 extend from a level corresponding to about the upper end of one of substrate areas 6, particularly the area 6b nearest to base 3 of body 2, to a level corresponding to about base 3 of body 2.

As regards the third ribs, these may be placed on all side regions 7, for example, just aligned with one of substrate areas 6 (perhaps with its upper half); in this way, they contribute to the control of the flow of reaction gases selectively over certain parts of side faces 5.

Equally important, in addition to the placement, is the choice of the sizes of the ribs, particularly their projection from the susceptor body; by the way, there is a proportion between the projection and the thickness of the grown material.

In order to better control the flow of reaction gases it is advantageous that first ribs 8 project from body 2 by a first quantity and that second ribs 9 project from body 2 by a second quantity; naturally, the first and the second quantities may be different.

In order to have an idea of the sizes of the projections, it may be simply said that, for a susceptor about 500 mm high and having a base diameter of about 350 mm, there have been tested projections from 1 mm to 10 mm.

In case that third ribs are used, these may project from body 2 by a third quantity that may also be different from both the first quantity and the second quantity.

According to a further aspect, the present invention relates also to an epitaxial reactor that comprises at least a reaction chamber wherein there is located at least a susceptor 1 having the features described above.

In FIG. 1 it is shown, in cross-section, a reaction chamber of an epitaxial reactor according to the present invention; from the figure there may be distinguished, among other things, the bell jar 10 and the susceptor 1 housed inside bell jar 10.

Figure 1:
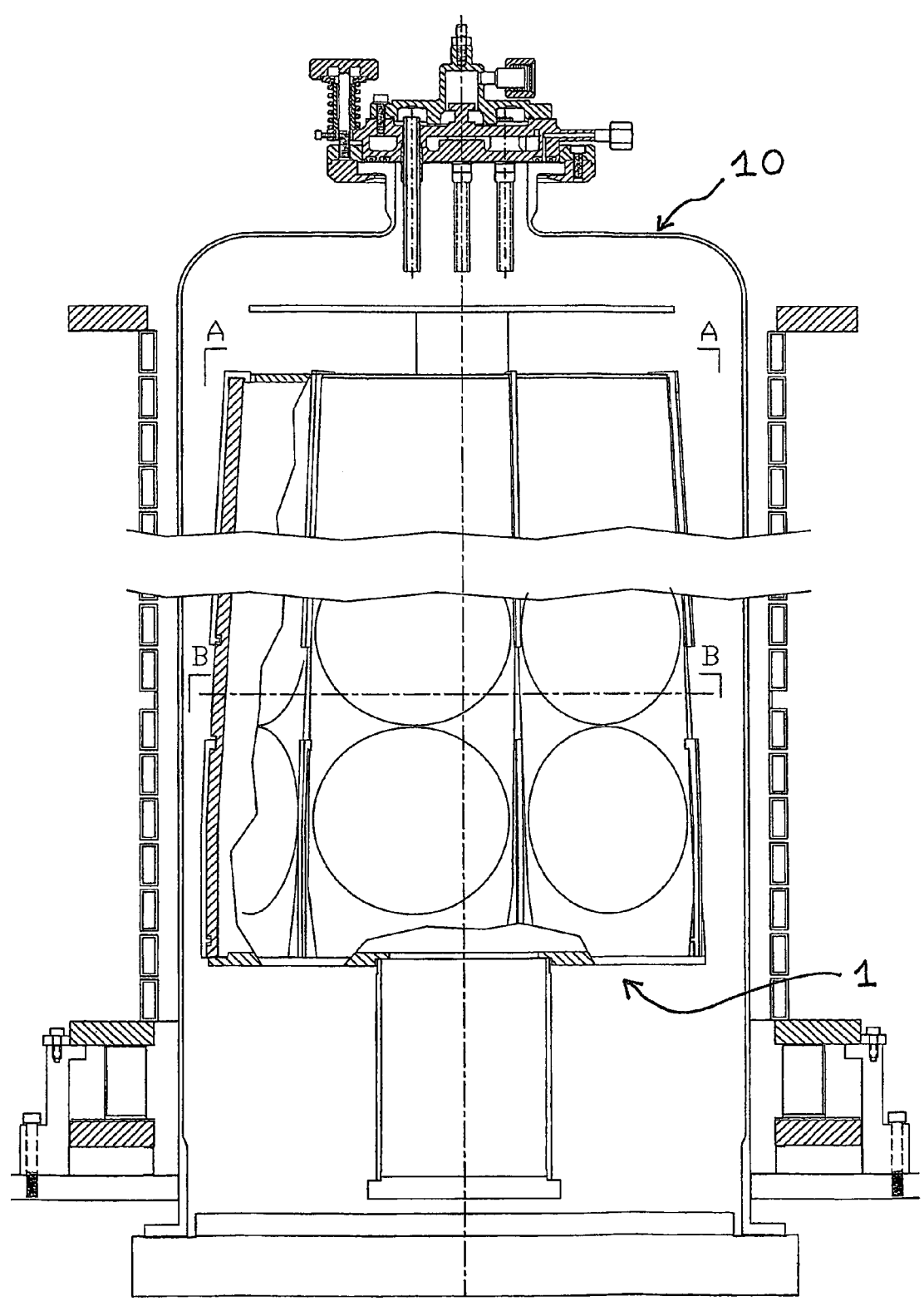
Figure 2:
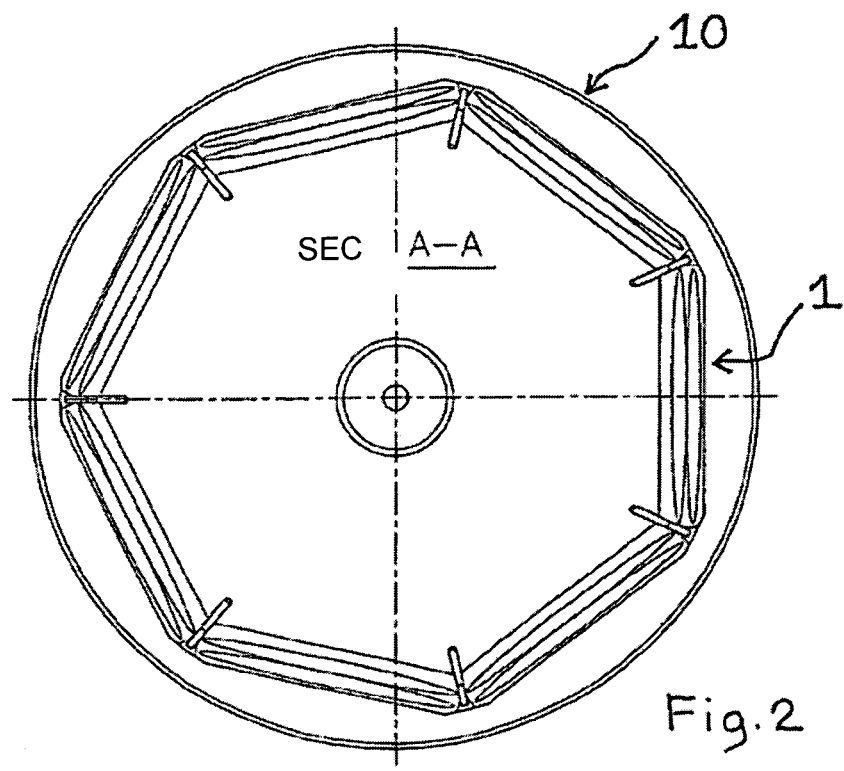
FIG. 2 shows a partial cross-section along a horizontal plane A—A of the chamber of FIG. 1; the cross-section is limited to the bell jar and the susceptor.
Figure 3:
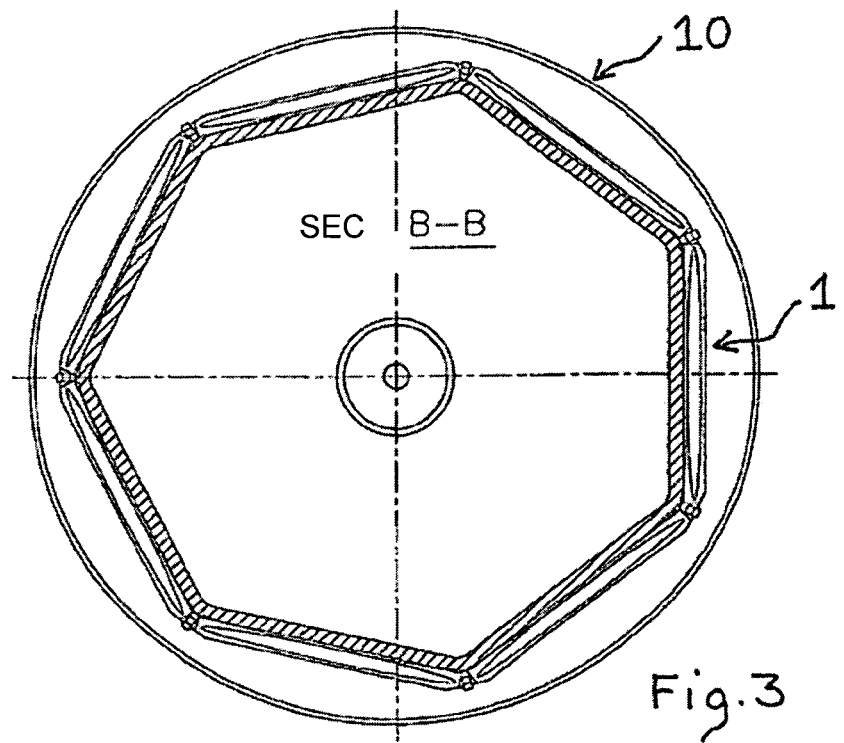
FIG. 3 shows a partial cross-section along a horizontal plane B—B of the chamber of FIG. 1; the cross-section is limited to the bell jar and the susceptor.
Figure 4:
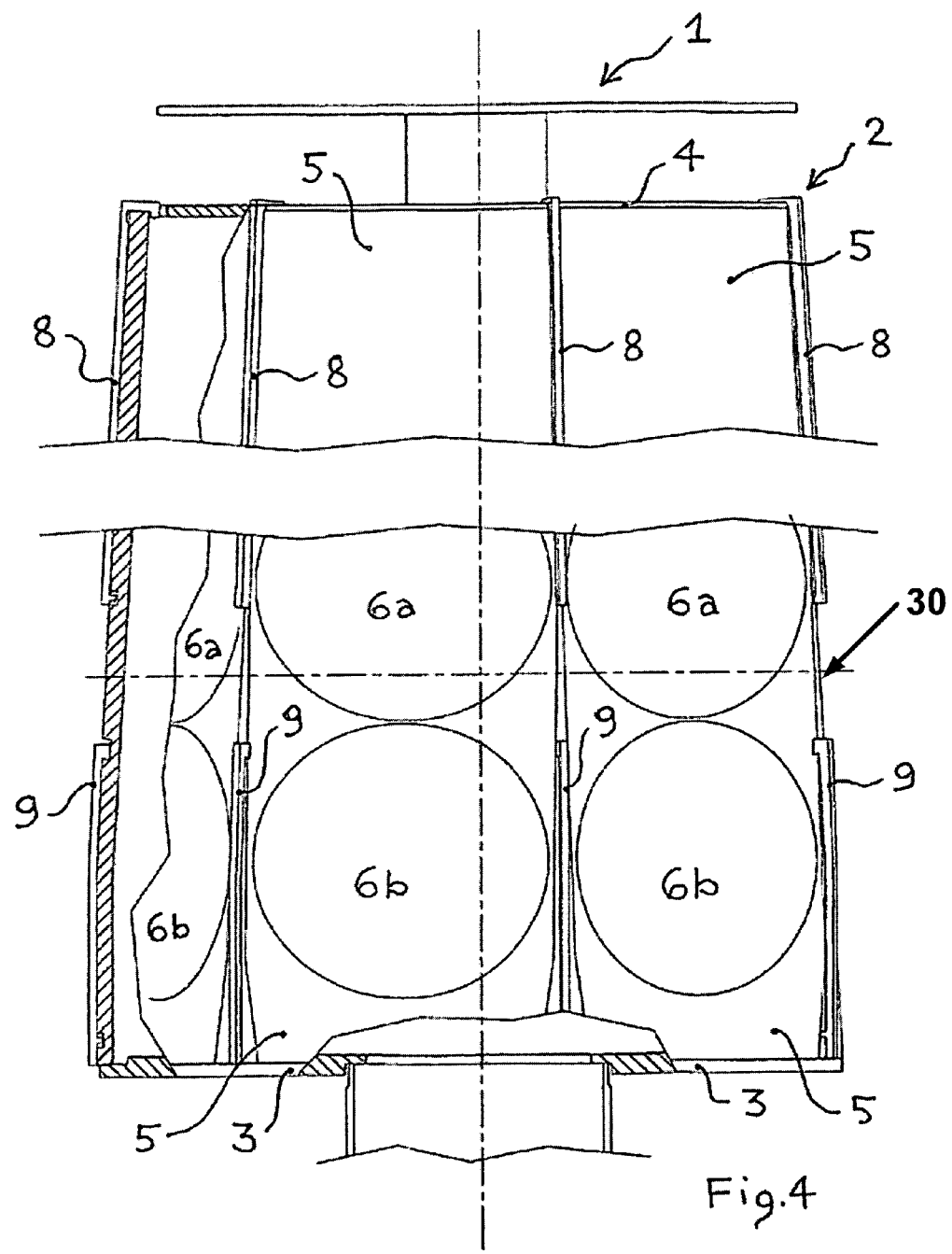
Figure 5:
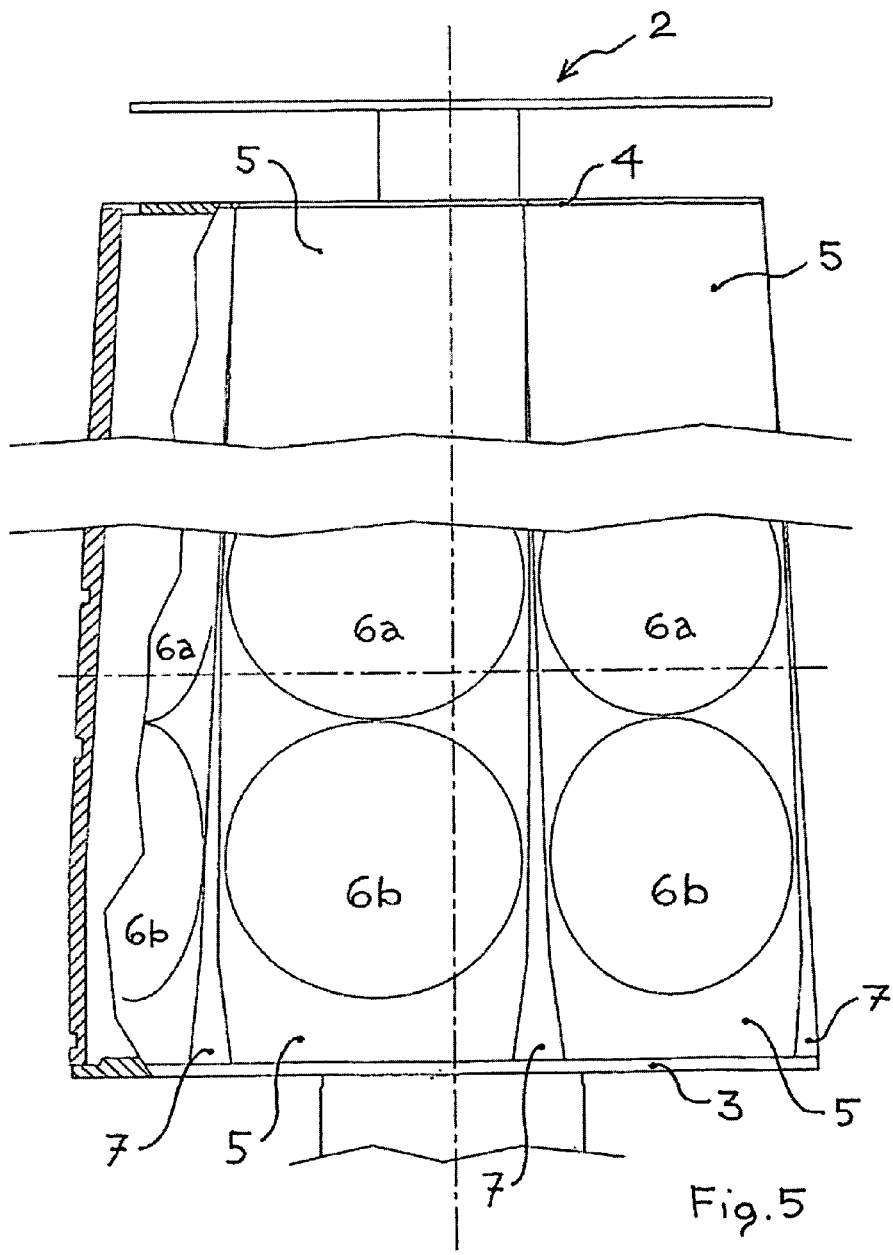

The invention claimed is:

1. A susceptor for epitaxial growth reactor comprising:
   a body having a lower part, an upper part and substantially flat side faces, said side faces being adapted to receive substrates in predetermined areas, on which the epitaxial growth develops;
   edge side regions disposed on the body the edge side regions comprising adjacent side faces;

first ribs provided along all said edge side regions in the upper part of the body, the first ribs adapted to control the flow of reaction gases along said side faces;

second ribs provided along all said edge side regions in the lower part of the body, the second ribs adapted to control a flow of reaction gases along said side faces;

the first and second ribs being spaced apart by a gap along the same edge side region, the gap being sized so that at least a portion of the substrates disposed in predetermined areas of one of the lower and upper part are exposed to a portion of the edge side region without one of the first and second ribs.

2. Susceptor according to claim 1, wherein along said edge side regions in the central part of the body there are provided at least third ribs adapted to control the flow of reaction gases along said side faces.

3. Susceptor according to claim 2, wherein one of said first and second and third ribs comprise a strip.

4. Susceptor according to claim 3, wherein the strip is provided with one of a hook and a tooth at a first end, and preferably with a centering pin at a second end, and wherein a strip is attached to said body through one said hook and tooth and said pin.

5. Susceptor according to claim 3, wherein the strip is provided with a groove on a side of the strip leaning on the body of the susceptor.

6. Susceptor according to claim 1, wherein said first ribs extend from a level corresponding to about the top of the body, to a level corresponding to about the centre of one of said substrate areas in the area nearest to the top of the body.

7. Susceptor according to claim 1, wherein said second ribs extend from a level corresponding to about the upper end of one of said substrate areas, particularly the area nearest to the base of the body, to a level corresponding to about the base of the body.

8. Susceptor according to claim 1, wherein said first ribs project from the body by a first quantity and wherein said second ribs project from the body by a second quantity.

9. Susceptor according to claim 8, wherein third ribs are provided on the body and project from the body by a third quantity.

10. An epitaxial growth reactor comprising:

a reaction chamber having a susceptor comprising a body having a lower part, an upper part and substantially flat side faces, said side faces being adapted to receive substrates in predetermined areas on which the epitaxial growth develops;

edge side regions disposed on the body, the edge side regions comprising adjacent side faces;

first ribs provided along said edge side regions in the upper part of the body, the first ribs adapted to control the flow of reaction gases along said side faces;

second ribs provided along said edge side regions in the lower part of the body, the second ribs adapted to control the flow of reaction gases along said side faces;

the first and second ribs being spaced apart by a gap, the gap being sized so that at least a portion of the substrates disposed in predetermined areas of one of the lower and upper part are exposed to a portion of the edge side region without one of the first and second ribs.

* * * * *